United States Patent [19]

Soyck et al.

[11] Patent Number: 4,994,738
[45] Date of Patent: Feb. 19, 1991

[54] PROXIMITY SWITCH FOR DETECTING A MAGNETIC INDUCTIVE FIELD

[76] Inventors: Gerno Soyck, Höveler Weg 47, D-5884 Halver; Peter Dahlheimer, Viktoriastr. 6, D-5885 Schalksmühle, both of Fed. Rep. of Germany

[21] Appl. No.: 297,489

[22] Filed: Jan. 17, 1989

Related U.S. Application Data

[63] Continuation-in-part of Ser. No. 33,151, Feb. 17, 1987, abandoned.

[30] Foreign Application Priority Data

Jun. 19, 1985 [DE] Fed. Rep. of Germany ....... 3521816

[51] Int. Cl.⁵ .................. G01B 7/14; H01H 35/00; H01H 83/00; G01N 27/00
[52] U.S. Cl. .......................... 320/207.13; 324/207.26; 324/236; 307/116; 331/65
[58] Field of Search ............... 324/173, 174, 207, 208, 324/234, 236; 336/30, 233, 110; 307/116; 331/65; 341/32

[56] References Cited

U.S. PATENT DOCUMENTS 3,271,204  9/1966  Glass ................................. 148/120
4,587,486  5/1986  Soyck .............................. 324/236
4,618,823  10/1986 Dahlheimer et al. ............. 324/207
4,678,994  7/1987  Davies ............................. 324/236

FOREIGN PATENT DOCUMENTS 1175327  4/1976  Fed. Rep. of Germany .
2829880  10/1981 Fed. Rep. of Germany .
3244507  6/1983  Fed. Rep. of Germany .
3423722  1/1986  Fed. Rep. of Germany .
3423724  1/1986  Fed. Rep. of Germany .

Primary Examiner—Walter E. Snow
Attorney, Agent, or Firm—Horst M. Kasper

[57] ABSTRACT

An inductive proximity switch comprises a high-frequency oscillator, an oscillator coil and an oscillator core. An analyzing circuit detects the inclination amplitude depending on the degree of core saturation. The analyzing circuit triggers a switching process when a certain threshold value of amplitude is reached. The core consists, for example, of ferrite. A yoke-like body is assigned to the core. The use of such a soft-magnetic material for the yoke-like body, allows the construction of smaller sensors with a higher sensitivity and a more cost-advantageous production. Their permeability curve in relation with one quadrant of the coordinate system is clearaly S-shaped.

5 Claims, 2 Drawing Sheets

PROXIMITY SWITCH FOR DETECTING A MAGNETIC INDUCTIVE FIELD

CROSS-REFERENCE TO RELATED APPLICATIONS

This application is a continuation-in-part application of another application filed Feb. 17, 1987 and bearing Serial No. 033,151, now abandoned, which prior application was based on the international application No. PCT/DE86/00230.

BACKGROUND OF THE INVENTION

1. Field of the Invention

The present invention relates to an inductive proximity switch, formed as a high-frequency generator, where the oscillator coil exhibits a core which is saturation-sensitive relative to a magnetic field to be determined.

2. Brief Description of the Background of the Invention Including Prior Art

A proximity switch is known from the German Patent Application Laid Open No. DE-OS 32 44 507. According to this reference, the core of an oscillator coil is made of ferrite and is closed by a corresponding yoke body. Consequently, based on an approach of a magnetic field or, respectively, by an intensification of a magnetic field, only a damping of the swinging oscillator can be achieved. A decrease of the oscillator current coincides with an increase in damping and, on the other hand, in opposite direction, removal of the damping is associated with an increase of the oscillator current. It is a requirement of the evaluation circuit that the changes of the oscillator current occurring in two directions are transformed by a switching circuit.

This proximity switch is associated in practical applications with the disadvantage of either not being sufficiently sensitive or that it cannot be produced in a sufficiently small size. In addition, an excess expenditure of switching techniques is required in order to transform the decrease of the oscillator current caused by the approach into an active switching command.

SUMMARY OF THE INVENTION

1. Purposes of the Invention

It is an object of the invention to provide a proximity switch, of the kind initially recited, with a more efficient physical relation.

It is another object of the present invention to reduce the production size and expenditure of an efficient proximity switch.

It is yet a further object of the present invention to simplify the construction of the circuits associated with the operation of a proximity switch.

These and other objects and advantages of the present invention will become evident from the description which follows.

2. Brief Description of the Invention

In accordance with the invention, an inductive proximity switch is provided, where a foil-shaped anchor plate, made of a soft magnetic metal alloy, is coordinated with a permeability, which allows to increase the oscillator current upon intensification of the magnetic field out of the damped state of the high-frequency generator in a defined way or, respectively, inversely, allows to decrease the oscillator current in case of a weakening of this field in a defined way again into the damped state of the oscillator circuit.

The formation of the sensor elements of an inductive proximity switch is achieved with the invention construction by generating eddies just in this anchor plate by the electromagnetic alternating field, penetrating via the air gap into the anchor plate. The eddies transform a large part of the electromagnetic energy into Joule heat and, simultaneously, also weaken the generated electromagnetic self-field. These eddy-current losses result in an intended damping of the high-frequency generator, which is represented in a marked decrease of the oscillator current. Based on the foil-shaped character of the anchor plate in general, there results in the anchor plate a clear skin effect, which is exhibited as a current displacement and a field displacement in the immediate surface region of the soft-magnetic plate, where in particular the field displacement is associated with a decrease of the magnetic flux.

For example now, if a magnet passes into the surveillance region of the sensor element, according to the invention, or if the sensor element passes into the region of a magnetic direct-current or alternating-current field, then the corresponding eddy-current field in the anchor plate is lifted, whereby the pre-damping of the high-frequency generator is eliminated and the oscillation results in a determinable increase of the oscillator current.

According to a further embodiment of the invention, it is provided that the anchor plate, disposed at an air gap distance, exhibits a particular geometric shape for influencing the eddies, specific to this apparatus, and the magnetic field lines, superposed from the outside. This step allows to influence the path of the eddies and their distribution, i.e. the current density, as well as the course of the magnetic field force lines, i.e. the magnetic field, within the apparatus penetrated by the high-frequency alternating field and of a situation associated anchor plate influenced by a superposed external field not only by the determination of the material having a certain permeability suited for this purpose and their film thickness, i.e. metal glass, but also by a special shape. It is particularly preferred to employ materials having a high permeability and a low coercivity, and in particular glassy metal alloys having such properties, but in addition, by providing a special structural shape. In this way, a certain response and directional characteristic can be provided to the proximity switch or, respectively, the sensor element of the proximity switch, which properties render the proximity switch in this small and micro construction suitable for various application fields. In addition, the large temperature stability of the invention material is important in this context in the formation of an anchor plate of the inductive proximity switch.

According to a further feature of the invention, one or several permanent magnet pieces can be coordinated at the anchor plate itself or in the proximity of the anchor plate. A premagnetization or overmagnetization of the anchor plate or, respectively, of a predisposed magnetic field defined within the capturing region of the anchor plate, is achieved against the electromagnetic alternating field of the oscillator, which gives a useful result for increasing the sensitivity, for decreasing the construction size, and for certain applications such as, for example, for the scanning of polarized external magnetic fields and the like.

A further embodiment of the invention allows to form the anchor plate, disposed at an air gap distance, into a wedge-shaped form, which wedge-shaped form is directed with a wide side toward the magnetic field to be captured, and which is supported with the oppositely-disposed tip, like a point or like a line, on the ferrite core. In case of a three-arm core or shell core, this can be performed for example on the center yoke arm. Still, there results a substantial air gap or empty space with respect to the proper sensor face relative to the mass of the core of the oscillator coil, even though a tip of the soft magnet material in fact contacts the core. From a physical point of view, however, just by this step, at the contact point there is generated a strong concentration of the magnetic flux lines from which, consequently, increased eddy-current losses result. Thus, there results an increase of the sensitivity and of the directional capability, as well as an advantageous possibility of decreasing of the dimensions of the proximity switch.

Relative to the high-frequency generator of the proximity switch, there exists the further feature and possibility to form the sensor coil on the input side or output side into the feed-back circuit of the oscillator as an air-gap inductor. Consequently, the core of this inductor coil carries then only one winding and exhibits at the location of the short-circuit yoke the anchor plate, disposed at an air gap distance according to the invention, as a sensor element of the proximity switch. This construction allows to produce smaller proximity switches, which are variable in their switching point effectiveness, where the coils of the oscillator circuits can be provided even without cores as air coils.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
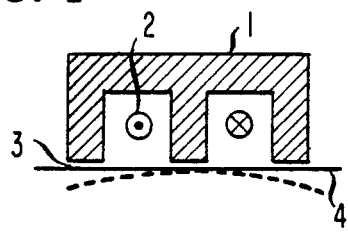
FIG. 1 is a schematic sectional view of an open three-arm core or, respectively, shell core of the oscillator coil with an anchor plate, placed at an air gap distance.
Figure 5:
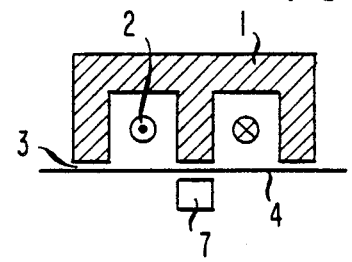
FIG. 5 is a sectional view of the sensor element according to FIG. 1 with a magnetic piece predisposed at a distance to the anchor plate.
Figure 3:
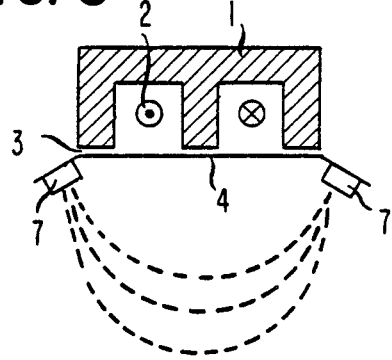
FIG. 3 illustrates the sensor element according to FIG. 1, with two magnet pieces disposed on the side of the anchor plate.
Figure 8:
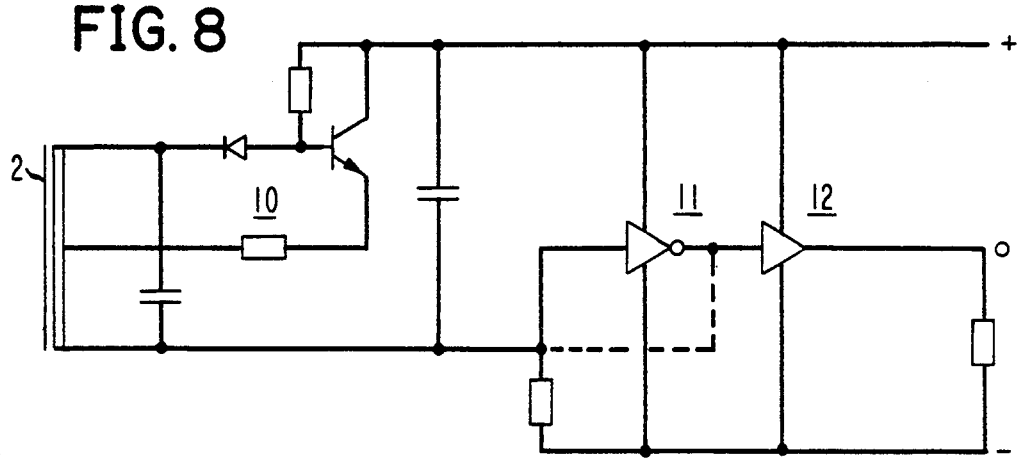
FIG. 8 is a diagram of the oscillator circuit, to be simplified, including the oscillator circuit/feed-back coil as a sensor element.
Figure 9:
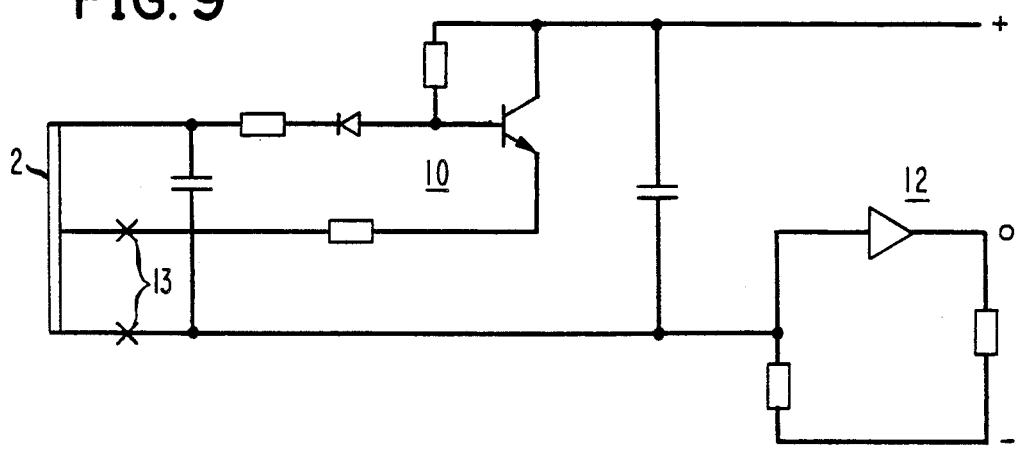
FIG. 9 is a switch-circuit diagram according to FIG. 8 with an air-gap inductor as a sensor element insertable into the feed-back circuit of the oscillator.

The sensor element, illustrated in FIG. 1, of the inductive proximity switch comprises a planar three-arm core 1 or a concentric shell core where the oscillator coil 2 of a high-frequency generator, according to FIGS. 8 or 9, is wound around the middle or center arm of the core. A foil-shaped anchor plate 4 is disposed in front of or, respectively, above the arm ends of the respective magnetic core 1 under formation of a defined air gap 3 in the direction of the magnetic field to be captured. This anchor plate, according to the invention, comprises a soft-magnetic metal alloy with a high permeability, which is preferably made of metal-glass, which exhibits a magnetic conductivity by about 25 times higher than the magnetic conductivity of ferrite.

Figure 2:
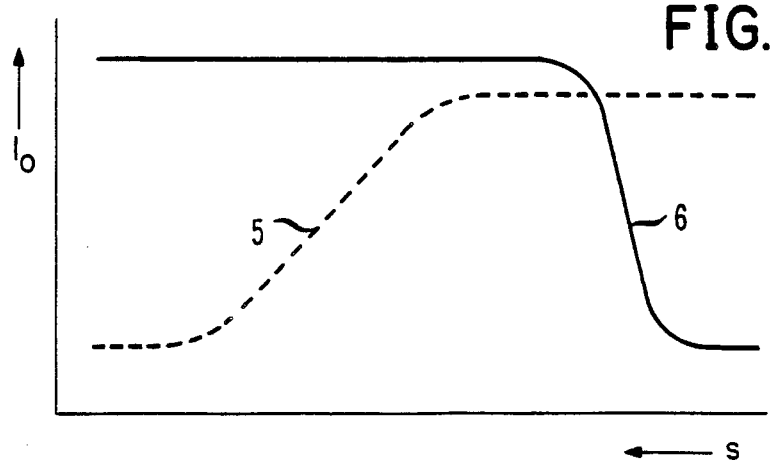
FIG. 2 is a graphic illustration of the oscillator current over the proximation path or, respectively, the degree of intensification of a magnetic field.

An eddy-current field is formed in such an anchor plate 4 based on this structure. The eddy-current field leads from the beginning to a constant damping of the high-frequency generator which, in case of an open magnet core, would be oscillating. This process is connected electronically with a substantial reduction of the oscillator current $I_o$. If an external magnet field approaches now the anchor plate 4 from the outside, then, starting with a certain intensity and/or spatial distance of the magnet field, the eddy-current field in the anchor plate 4 is lifted, and consequently the high-frequency generator is de-damped, and consequently the oscillator current $I_o$ is increased to a value which corresponds to the oscillating state. This situation can be recognized from FIG. 2, where the abscissa illustrates the oscillator current $I_o$ depending on the approach path s of the magnet field. The dashed characteristic curve 5 represents the behavior of the inductive proximity switch according to the German Patent Application Laid Open No. DE-OS 3,244,507 for comparison purposes, according to which the oscillator current $I_o$ decreases continuously upon the approach of the external magnetic field. In contrast, the characteristic curve 6 of the invention proximity switch provides for the first time an exactly opposite behavior. The oscillator current $I_o$ increases of the damped phase already at an earlier point in time, i.e. at a larger distance, and the slope is more pronounced and steeper for entering into the oscillating phase. Consequently, the invention proximity switch cannot only be realized in a better way from a switching technical point of view, but this switch has a substantially more sensitive response than conventional constructions for this purpose.

Since the anchor plate 4, disposed at an air gap distance, at the same time serves as a damping member for the oscillator as well as a proper sensor element of the inductive proximity switch, there arises the possibility to influence the application and function not only by the selection of a certain metal alloy and thickness, but also by the geometric form and shape of the anchor plate 4, as well as by a direct or indirect premagnetization of the anchor plate. The anchor plate 4, coordinated to a shell core 1 according to FIG. 1, not illustrated in detail in the drawing, can exhibit certain shapes: it can for example be smaller or larger than the core face, it can be round, rectangular, with contractions or possibly, at the same time, be arched or, respectively, be provided with angles, in order to obtain, in each case, a typical reaction of the inductive proximity switch relative to the approaching or moving-away external magnetic field. In addition, one or two permanent magnet pieces 7, disposed polarized on the anchor plate 4 or fixed relative to the anchor plate at a certain distance, can further influence the respective switching processes. For this purpose, FIGS. 1 and 3 to 5 illustrate a few of the numerous possible embodiments.

Figure 6:
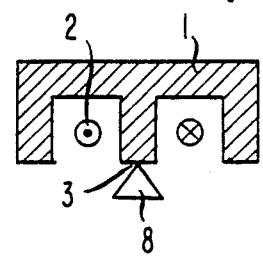
FIG. 6 is a schematic sectional view of the open shell core of the oscillator coil with a wedge-shaped anchor plate structure supported centrally on the open shell core.
Figure 4:
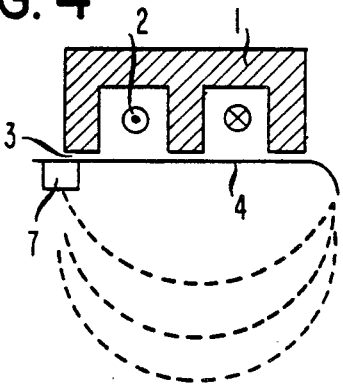
FIG. 4 is a schematic sectional view of the sensor element according to FIG. 3 with only one magnetic piece attached to the side.

The sensor element illustrated in FIG. 6 of the inductive proximity switch employs, in place of the foil-shaped anchor plate 4, a wedge-shaped, a cone-shaped, or also a ball-shaped compact or hollow-body structure 8, which is supported with its tip, like a point or like a line, on the center yoke arm of the three-arm core 1, and which directs, with the oppositely wide side, in the direction of the external magnetic field to be captured. In this construction, despite the contact between the core and the anchor, there is present an empty space for the magnetic line of force, substantially corresponding to that of an air gap, in the surrounding of the contact location. This construction is thus particularly suited for small construction forms with a pronounced directional characteristic.

Figure 7:
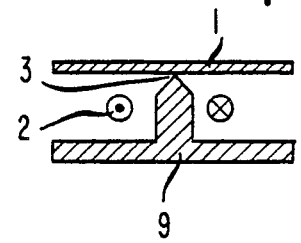
FIG. 7 is a schematic sectional view of an anchor structure immersed into an oscillator air gap and with a knife support behind.

In addition, a sensor element is illustrated in FIG. 7, where the anchor plate 9, formed as a T-shape in cross-section, is supported like a wedge on a core traverse 1. The oscillator coil is formed as an air coil 2 wound around the corresponding support arm and the cross arm of the structure is again directed toward the magnetic field to be captured. In this embodiment, the construction has a particularly sensitive response, it saves material and it is of low cost.

The electronic circuit schematically illustrated in FIG. 8 of the drawing of an inductive proximity switch comprises the transistorized high-frequency generator 10 with the oscillator coil 2, formed as a sensor element according to the invention, in connection with an evaluation circuit comprising an amplifier stage 11 and a final stage 12. In view of the inverse function of the invention high-frequency generator 10 where now, in contrast to the state of the art, the slope of the oscillator current effects the switching process, the reversing stage 11, which has hitherto been indispensable, can be eliminated and thus the associated circuit expenditure can be decreased.

Figure 10:
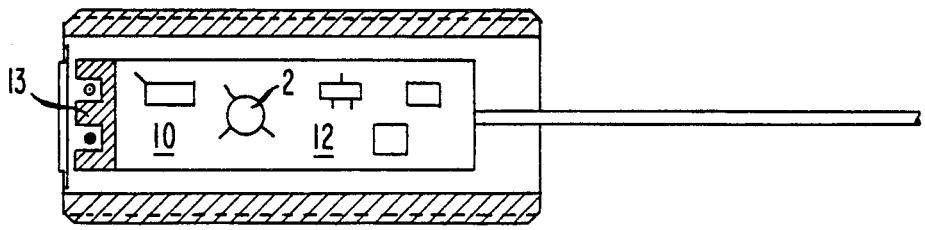
FIG. 10 is a schematic sectional view of an embodiment of the inductive proximity switch according to FIG. 9 in a dimensional ratio of 10:1.

Furthermore, there is illustrated in FIG. 9 of the drawing a correspondingly reduced circuit arrangement, where the sensor element for this purpose is no longer formed by the oscillator coil 2, but instead by an air-gap inductor 13, which can be entered at x on the input side or on the output side into the feed-back circuit of the high-frequency generator 10 in order to vary the evaluation circuit as desired. The actual constructive embodiment of such a simplified and correspondingly miniaturizable proximity switch is sketched in FIG. 10 of the drawing, again in a schematic way.

It Will be understood that each of the elements described above, or two or more together, may also find a useful application in other types of proximity switches differing from the types described above.

While the invention has been illustrated and described as embodied in the context of a magnetic-field-dependent inductive proximity switch, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letter Patent is set forth in the appended claims.

We claim:

1. Inductive proximity switch comprising a high-frequency oscillator, wherein an oscillator coil is provided with an open core, saturation-sensitive to a magnetic field to be detected, in connection with an evaluation circuit, which detects the oscillation amplitude depending on the degree of the core saturation, and which, upon reaching of a certain amplitude value, triggers a switching process, wherein a foil-shaped anchor plate (4), made of a soft-magnetic metal alloy with a certain permeability, is coordinated to the open core (1) of the oscillator coil (2) under formation of an air gap (3), which anchor plate allows an oscillator current ($I_o$) to rise in a defined way upon intensification of the magnetic field from the damped state of said high frequency oscillator (10) or, respectively, upon a weakening of this field allows in a defined way to drop again in a damp state.

2. Inductive proximity switch according to claim 1, wherein the anchor plate (4), disposed at an air-gap distance, is provided with a particular geometric shape for the influencing the eddies of the magnetic flux lines.

3. Inductive proximity switch according to claim 1, wherein the anchor plate (4), disposed at an air-gap distance, has coordinated to itself or in its proximity at least one permanent magnet piece (7).

4. Inductive proximity switch according to claim 1, wherein the anchor plate, disposed at an air-gap distance, is formed to a wedge-shaped structure (8), which is directed with its wide side toward the magnetic field to be detected, and which is, by way of the oppositely disposed tip, supported like a point or like a line on the core wherein the core is shaped as a three-armed core or as a pot-shaped magnet core.

5. Inductive proximity switch according to claim 1, wherein the sensor coil is formed as an inserted air-gap inductor (13) switched on the input side or on the output side into a feed-back circuit of the high-frequency oscillator (10).

* * * * *